(12) United States Patent
Iijima et al.

(10) Patent No.: US 9,064,780 B2
(45) Date of Patent: Jun. 23, 2015

(54) SEMICONDUCTOR DEVICE

(71) Applicant: Kabushiki Kaisha Toshiba, Minato-ku (JP)

(72) Inventors: Ryosuke Iijima, Tokyo (JP); Tatsuo Shimizu, Tokyo (JP); Johji Nishio, Tokyo (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 31 days.

(21) Appl. No.: 14/143,332

(22) Filed: Dec. 30, 2013

(65) Prior Publication Data

US 2014/0191247 A1    Jul. 10, 2014

(30) Foreign Application Priority Data

Jan. 9, 2013    (JP) .................................. 2013-002079

(51) Int. Cl.
| | | |
|---|---|---|
| *H01L 29/00* | (2006.01) | |
| *H01L 29/16* | (2006.01) | |
| *H01L 29/04* | (2006.01) | |
| *H01L 29/78* | (2006.01) | |

(52) U.S. Cl.
CPC ............ *H01L 29/1608* (2013.01); *H01L 29/04* (2013.01); *H01L 29/78* (2013.01)

(58) Field of Classification Search
None
See application file for complete search history.

(56) References Cited

U.S. PATENT DOCUMENTS

| | | | |
|---|---|---|---|
| 2003/0073270 A1* | 4/2003 | Hisada et al. ................. | 438/197 |
| 2005/0181536 A1* | 8/2005 | Tsuji ............................ | 438/105 |

FOREIGN PATENT DOCUMENTS

JP    2005-244180    9/2005

OTHER PUBLICATIONS

R. Kosugi, et al., "Fabrication of double implanted (0001) 4H-SiC MOSFETs by using pyrogenic re-oxidation annealing", Materials Science Forum, vols. 457-460, 2004, 4 pages.

* cited by examiner

*Primary Examiner* — Victor A Mandala
*Assistant Examiner* — Quovaunda V Jefferson
(74) *Attorney, Agent, or Firm* — Oblon, McClelland, Maier & Neustadt, L.L.P.

(57) ABSTRACT

According to one embodiment, a semiconductor device includes a gate electrode, a first semiconductor region, a second semiconductor region of a first conductivity type, a third semiconductor region of a second conductivity type and a fourth semiconductor region of the first conductivity type. The first semiconductor region includes a silicon carbide crystal of 4H—SiC. The second semiconductor region includes a first portion opposing the gate electrode and is provided between the gate electrode and the first semiconductor region. The third semiconductor region has a lattice spacing different from a lattice spacing of the silicon carbide crystal of 4H—SiC and is provided between the gate electrode and the second semiconductor region. The fourth semiconductor region is selectively provided on the third semiconductor region.

20 Claims, 11 Drawing Sheets

SEMICONDUCTOR DEVICE

CROSS-REFERENCE TO RELATED APPLICATIONS

This application is based upon and claims the benefit of priority from Japanese Patent Application No. 2013-002079, filed on Jan. 9, 2013; the entire contents of which are incorporated herein by reference.

FIELD

Embodiments described herein relate generally to a semiconductor device.

BACKGROUND

Silicon carbide (SiC) is expected to be a material for a next generation power semiconductor device. In comparison with Si, SiC has excellent physical properties such as threefold band gap, about tenfold breakdown field strength, and about threefold thermal conductivity. Utilizing these characteristics allows an ultralow loss and high temperature operable power semiconductor device to be realized. As one of a various high breakdown voltage semiconductor device, an MOSFET having an upper/lower electrode structure having an $n^+$-type source region, a p-type well region, an n-type drift region on a surface side of a SiC substrate and an $n^+$-type drain region on a back side is illustrated. A mobility of an inversion layer electron of the MOSFET (channel mobility) is lower than a value expected from a material limit of SiC. In order to improve an element performance, namely to reduce an element resistance, it becomes necessary to improve the channel mobility. Until now, the improvement of mobility has been realized in a stepwise fashion by changing a forming condition of a gate insulating film. Further improvement is required.

DETAILED DESCRIPTION

Figure 1A:
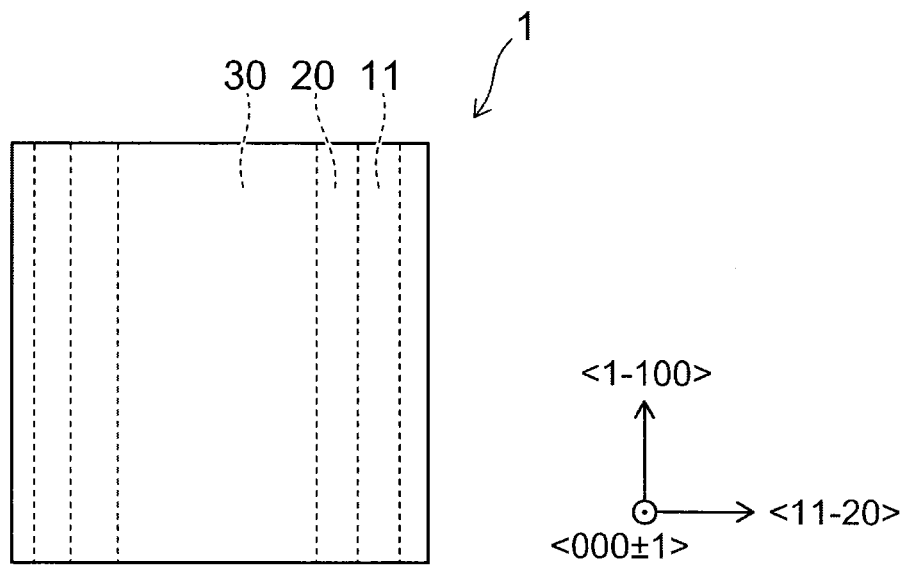
FIG. 1A is a schematic plan view showing a semiconductor device according to a first embodiment.

According to one embodiment, a semiconductor device includes a gate electrode, a first semiconductor region, a second semiconductor region of a first conductivity type, a third semiconductor region of a second conductivity type and a fourth semiconductor region of the first conductivity type. The first semiconductor region includes a silicon carbide crystal of 4H—SiC. The second semiconductor region includes a first portion opposing the gate electrode and is provided between the gate electrode and the first semiconductor region. The third semiconductor region has a lattice spacing different from a lattice spacing of the silicon carbide crystal of 4H—SiC and is provided between the gate electrode and the second semiconductor region. The fourth semiconductor region is selectively provided on the third semiconductor region.

Various embodiments will be described hereinafter with reference to the accompanying drawings. In the drawings, like members are labeled with like reference numerals. For members that have been described once, the description is omitted as appropriate. Embodiments are not limited to the following contents.

First Embodiment

Figure 1B:
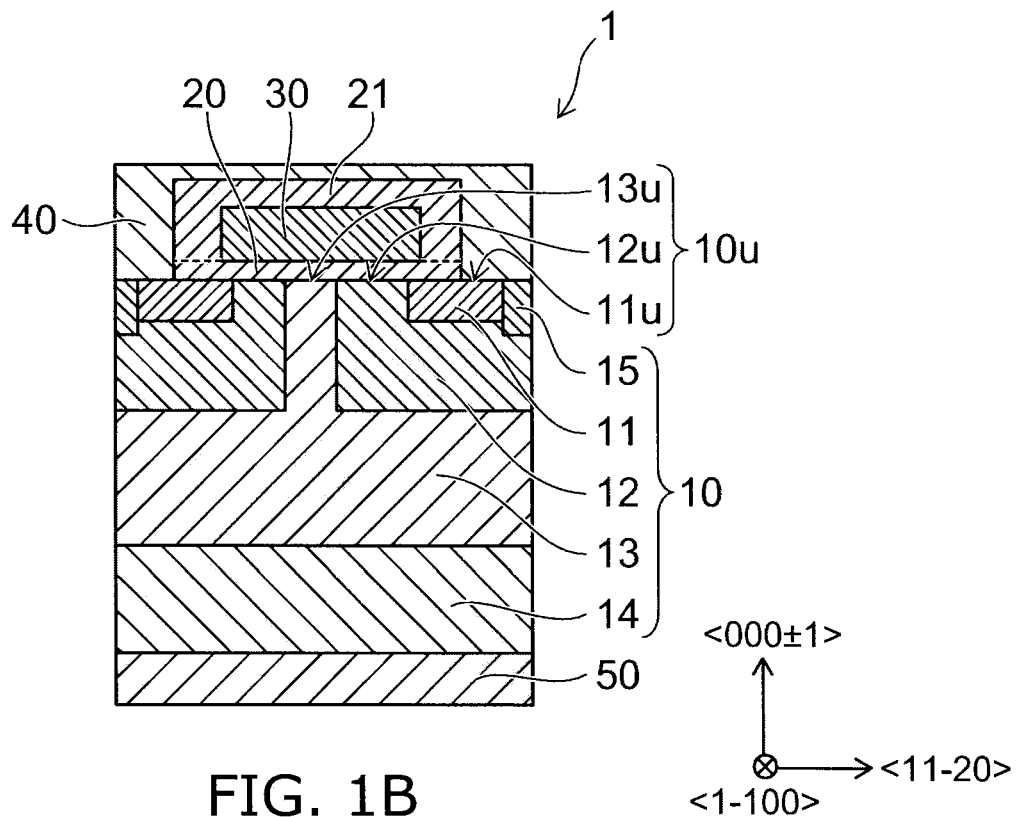
FIG. 1B is a schematic cross-sectional view showing the semiconductor device according to the first embodiment.

FIG. 1A is a schematic plan view showing a semiconductor device according to a first embodiment, and FIG. 1B is a schematic cross-sectional view showing the semiconductor device according to the first embodiment.

A semiconductor device according to the first embodiment is a MOSFET having an upper/lower electrode structure. The semiconductor device 1 includes a semiconductor layer 10, a gate insulating film 20 provided on the semiconductor layer 10, and a gate electrode 30 provided on the gate insulating film 30. The semiconductor layer 10 has silicon carbide crystal with a crystal polymorph of 4H—SiC.

The semiconductor layer 10 has an $n^+$-type source region 11, a p-type well region 12, an n-type drift region 13, and an $n^+$-type drain region 14. In the embodiment, the drain region 14 may be a first semiconductor region, the drift region 13 may be a second semiconductor region, the well region 12 may be a third semiconductor region, and the source region 11 may be a fourth semiconductor region. The well region 12 may be appropriately replaced with a base region 12, a body region 12 or the like.

The well region 12 surrounds a portion other than a surface 11u of the source region 11. That is to say, the source region 11 is provided selectively in the well region 12. The well region 12 has a lattice spacing different from a lattice spacing of the silicon carbide crystal of 4H—SiC included in the drain region 14. The well region 12 is provided between the gate electrode 30 and the drift region 13.

The drift region 13 surrounds a portion other than a surface 12u of the well region 12. The drift region 13 has a portion opposing the gate electrode 30. This portion is a portion of the drift region 13 sandwiched between adjacent well regions 12. The drift region 13 is provided between the gate electrode 30 and the drain region 14.

The drain region 14 is provided under the drift region 13. A concentration of an impurity in the drift region is lower than a concentration of an impurity in the drain region 14. In addition, the semiconductor layer 10 has a p+-type contact region 15 being in contact with the source region 11. The p+-type contact region 15 may be appropriately removed.

The gate insulating film 20 is provided on the surface 12u of the well region 12, on a portion of the surface 11u of the source region 11 being in contact with the well region 12, and on at least a portion of a surface 13u of the drift region 13. The gate electrode 30 provided on the gate insulating film 20 is covered with an interlayer insulating film 21.

The surface 12u of the well region 12, the surface 11u of the source region 11, and the surface of the drift region 13 are referred to as a surface 10u of the semiconductor layer 10 in total. In the surface 10u of the semiconductor layer 10 being in contact with the gate insulating film 20, a boundary between the source region 11 and the well region 12 is orthogonal to a direction of <11-20>. In the surface of the surface 10u of the semiconductor layer 10 being in contact with the gate insulating film 20, a boundary between the well region 12 and the drift region 13 is orthogonal to the direction of <11-20>. In the surface of the surface 10u of the semiconductor layer 10 being in contact with the gate insulating film 20, a direction from the source region 11 toward the drift region 13 is parallel to the direction of <11-20>.

The semiconductor device 1 includes a source electrode 40 being in contact with the source region 11, and a drain electrode 50 being in contact with the drain region 14. p-type, p+-type impurity elements added to the semiconductor layer are, for example, group III elements such as aluminum (Al) or the like. n-type, n+-type impurity elements added to the semiconductor layer are phosphorous (P) or the like.

In the silicon carbide crystal included in the well region, a lattice spacing of the silicon carbide crystal of a portion (for example, a portion having a channel formed) of the well region 12 being in contact with the gate insulating film 20 is different from a lattice spacing of the silicon carbide crystal included in the drain region 14. Here, the portion of the well region 12 being in contact with the gate insulating film 20 means the well region 12 within a distance of at least 3 nm (nanometers) from the boundary between the well region 12 and the gate insulating film 20 toward the drain region 14.

In the embodiment, there is a case where the distance of at least 3 nm from the boundary between the well region 12 and the gate insulating film 20 toward the drain region 14 is called as "a vicinity of the well region surface". There is a case where the distance of at least 3 nm from the boundary between the semiconductor layer 10 and the gate insulating film 20 toward the drain region 14 is called as "a vicinity of the semiconductor layer surface".

Figure 2:
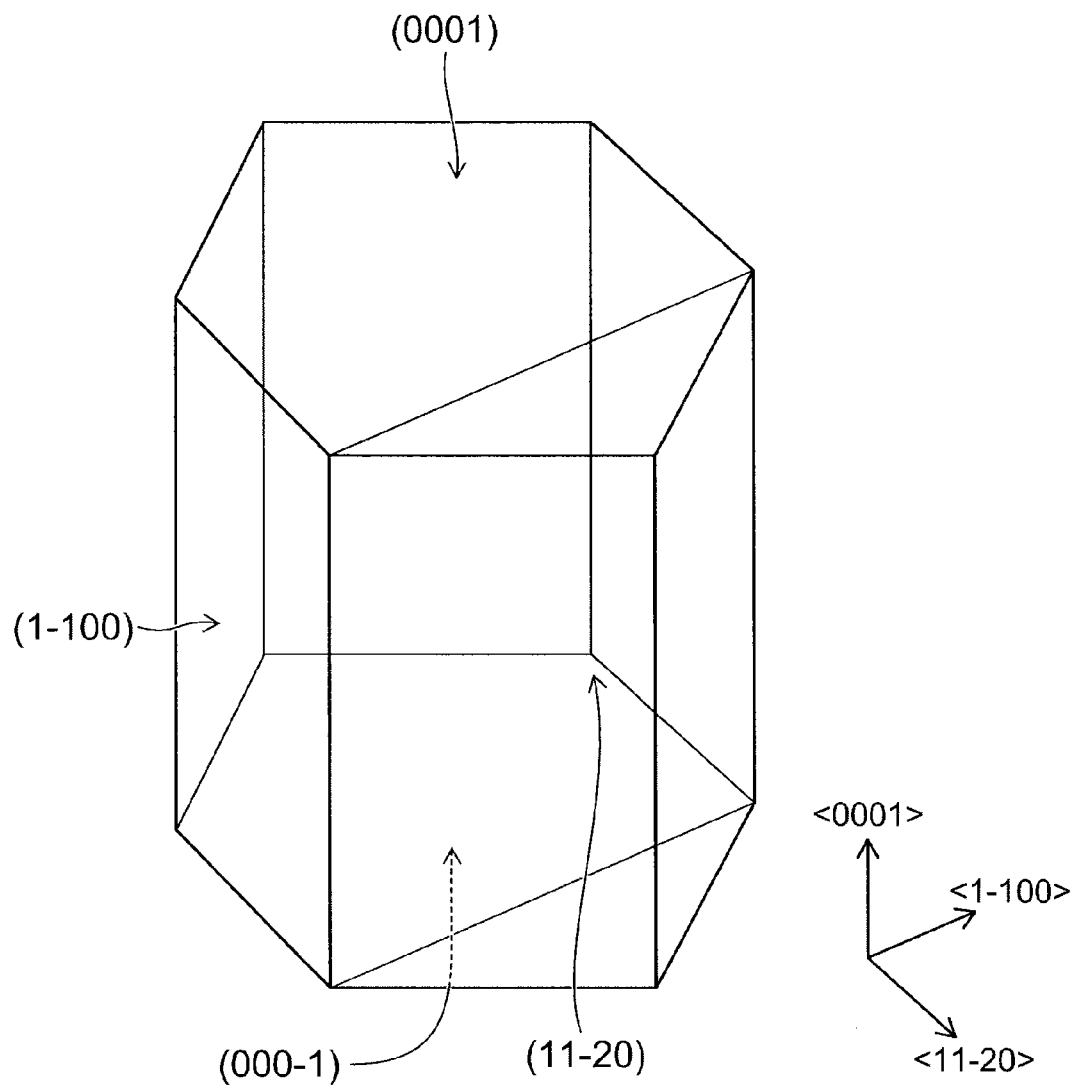
FIG. 2 is a cubic diagram showing a plane direction of silicon carbide crystal with a crystal polymorph of 4H—SiC.

FIG. 2 is a cubic diagram showing a plane direction of silicon carbide crystal with a crystal polymorph of 4H—SiC.

The silicon carbide crystal of 4H—SiC has a (0001) crystal plane, a (1-100) crystal plane, and a (11-20) crystal plane or the like. A direction perpendicular to the (0001) crystal plane is a <0001> direction. A direction perpendicular to the (1-100) crystal plane is a <1-100> direction. A direction perpendicular to the (11-20) crystal plane is a <11-20> direction. In addition, a plane opposite to the (0001) crystal plane is a (000-1) crystal plane.

In the semiconductor device 1 shown in FIG. 1, the surface 10u of the semiconductor layer 10 is taken as the (0001) crystal plane. In the embodiment, the surface 10u of the semiconductor layer 10 includes the (000-1) plane opposite to the (0001) crystal plane illustratively. That is, the surface 10u of the semiconductor layer 10 being in contact with the gate insulating film 20 is the (0001) crystal plane or the (000-1) crystal plane.

A direction in which the drain region 14 is stacked with the drift region is the <0001> direction. When the surface 10u of the semiconductor layer 10 is the (000-1) crystal plane, the direction in which the drain region 14 is stacked with the drift region is the <000-1> direction, and thus FIG. 1 describes the stacking direction as <000±1>.

In the semiconductor device 1 shown in FIG. 1, a direction from the source region 11 toward the drift region 13 in parallel to the surface 10u of the semiconductor layer 10 is taken as the <11-20>. The direction <11-20> corresponds to a current direction when a channel region is formed in the well region 12 as well. When a potential not less than the threshold value is applied to the gate electrode 30, the channel region is formed along the boundary between the well region 12 and the gate insulating film 20.

Figure 3:
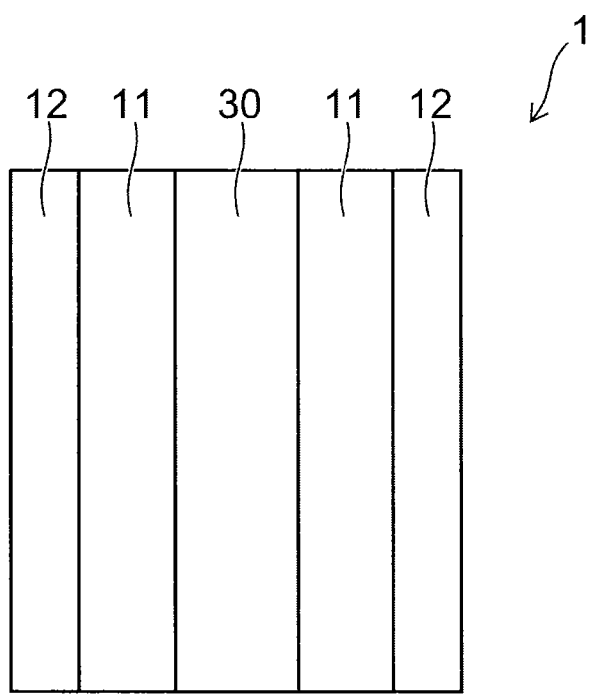
FIG. 3 is a schematic plan view showing the semiconductor device according to the first embodiment.
Figure 3:
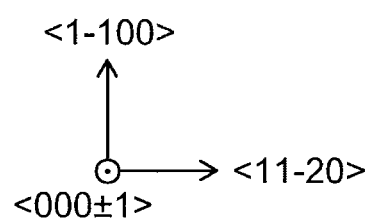

FIG. 3 is a schematic plan view showing the semiconductor device according to the first embodiment.

FIG. 3 shows an upper surface of the semiconductor device 1 in a state where the source electrode 40, the interlayer insulating film 21, the gate insulating film 20, and the contact region 15 are removed from the semiconductor device 1 shown in FIG. 1.

As shown in FIG. 3, each of the gate electrode 30, the source region 11 and the well region 12 extends in the <1-100> direction. The direction of the current flowing in the channel region is approximately uniform in the <11-20> direction within the semiconductor device 1.

Figure 4:
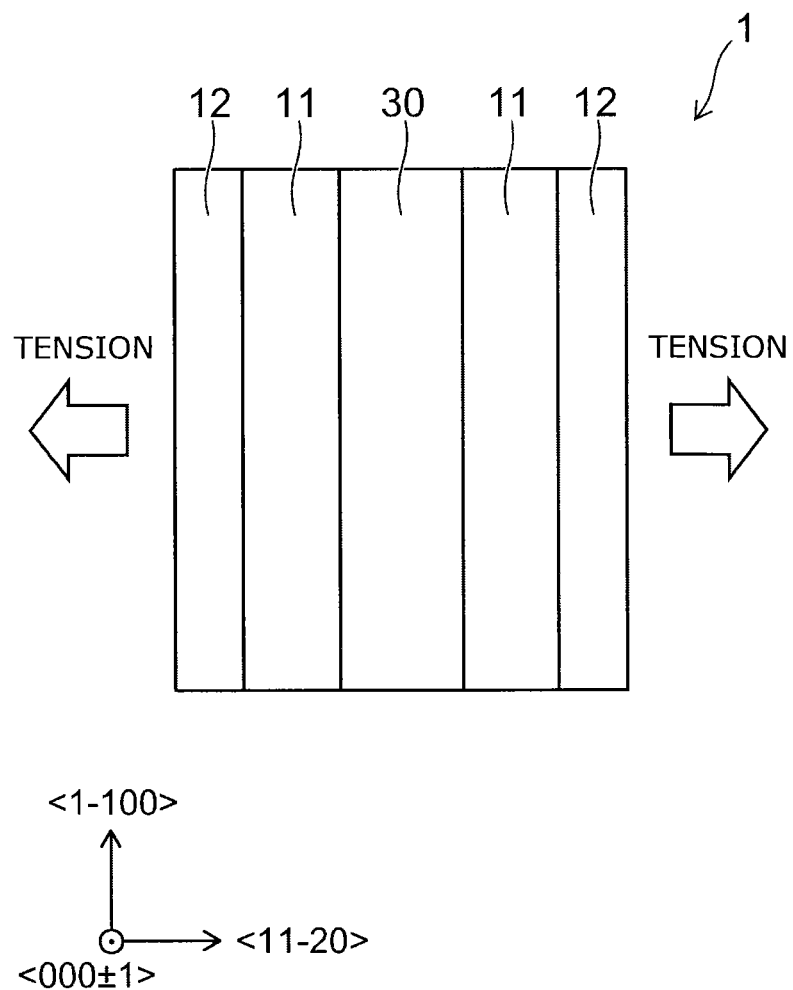
FIG. 4 is a schematic plan view showing an aspect of a strain applied to a surface of a semiconductor layer of the semiconductor device according to the first embodiment.

FIG. 4 is a schematic plan view showing an aspect of a strain applied to the surface of the semiconductor layer of the semiconductor device according to the first embodiment.

On the surface 10u of the semiconductor layer 10 and in the vicinity of the surface 10u, a tensile stress pulling the surface 10u of the semiconductor layer 10 and the vicinity of the surface 10u is applied in parallel to the <11-20> direction. As a result, a lattice spacing of the silicon carbide crystal in the <11-20> direction on the surface 10u of the semiconductor layer 10 and in the vicinity of the surface 10u is longer than a lattice spacing of the silicon carbide crystal in the <11-20> direction in a deep region inside the semiconductor region 10. Here, the deep region inside the semiconductor layer 10 is a region removing the surface 10u of the semiconductor layer 10 and the vicinity of the surface 10u.

Thereby, a lattice spacing of the silicon carbide crystal in the <11-20> direction on the surface 12u of the well region 12 and in the vicinity of the surface 12u is longer than a lattice spacing of the silicon carbide crystal included in the drain region 14 in the <11-20> direction. The surface 12u of the well region 12 and the vicinity of the surface 12u include the channel region.

Figure 5A:
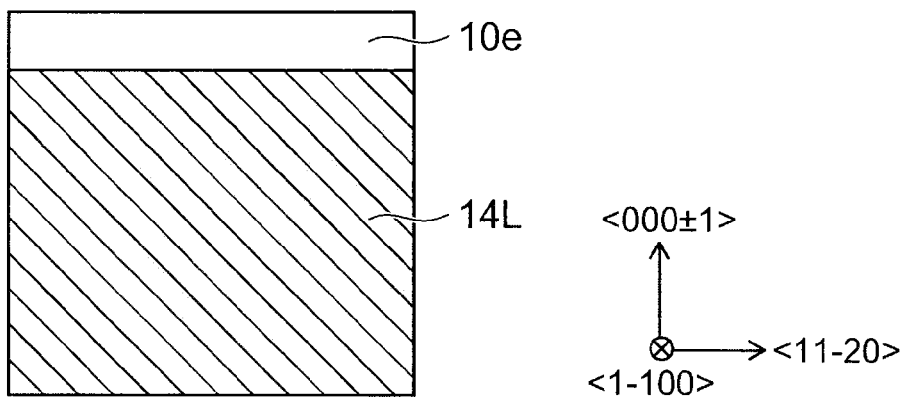
FIG. 5A to FIG. 5C are schematic plan views showing a method for applying the strain to the surface of the semiconductor layer of the semiconductor device according to the first embodiment.
Figure 5B:
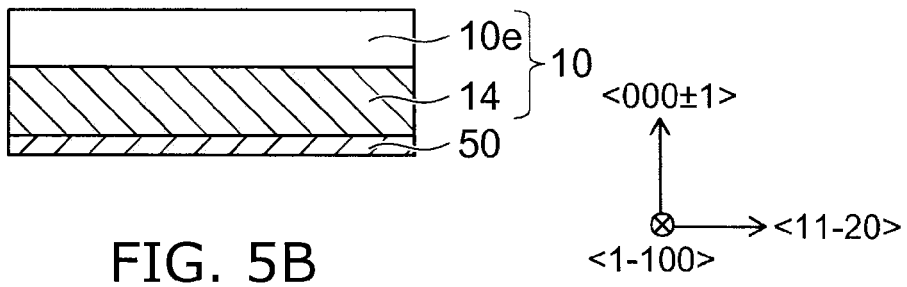
Figure 5C:
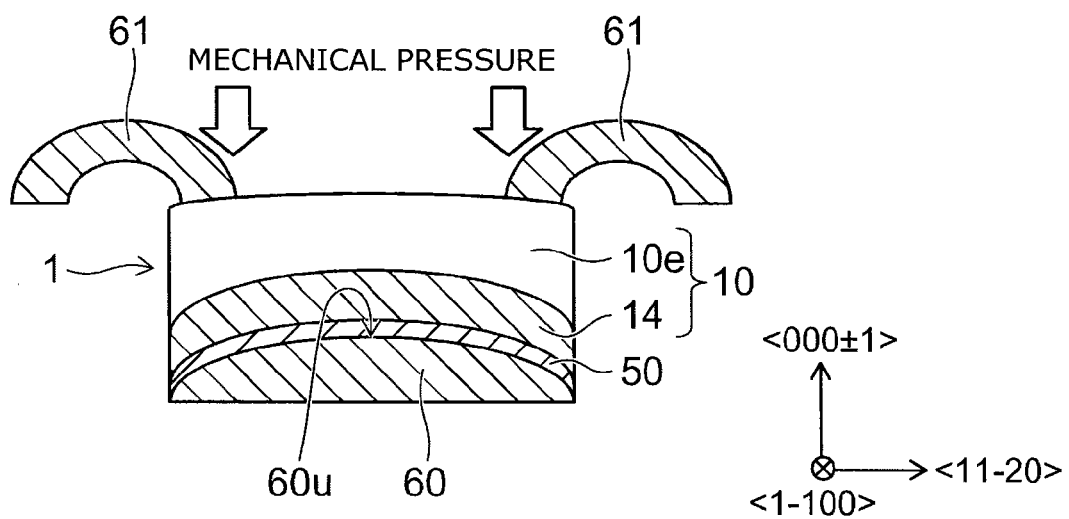

FIG. 5A to FIG. 5C are schematic plan views showing a method for applying the strain to the surface of the semiconductor layer of the semiconductor device according to the first embodiment.

FIG. 5A to FIG. 5C show a process including a process for forming the semiconductor device according to the first embodiment and a mounting process.

First, as shown in FIG. 5A, an element region 10e is formed on a drain layer 14L. Here, the element region 10e is a region on an upper side above the drain region 14 of the semiconductor device 1 shown in FIG. 1. A thickness of the drain layer 14L is 360 μm. A thickness of the element region 10e is 15 μm.

Next, as shown in FIG. 5B, a back side of the drain layer 14L is polished and the drain layer 14L is thinned. Thereby, the drain region 14 is formed on a lower side of the element region 10e. Furthermore, the drain electrode 50 is formed under the drain region 14.

Thinning the drain layer 14L reduces a resistance of the drain region 14 lower than a resistance of the drain layer 14L. Thinning the drain layer 14L operates advantageously for reducing an ON resistance of the MOSFET. If the thickness of the semiconductor layer is decreased, the semiconductor layer 10 is easily transformed when the semiconductor layer 10 receives an external stress.

Next, as shown in FIG. 5C, after placing the semiconductor device 1 on an electrode terminal 60, the semiconductor device 1 is mounted on the electrode terminal 60. An electrode terminal 61 is connected to the source electrode 40 of the element region 10e.

Here, when the electrode terminal 60 is cut perpendicularly to the <1-100> direction, a line configuration of an upper surface 60u of the electrode terminal 60 depicts a circular arc being convex upward. In the mounting, a mechanical pressure is applied to the semiconductor layer 10 from above the source regions 11 on both sides of the gate electrode 30.

By this mounting, a stress is applied to the semiconductor layer 10 so that the surface 10u of the semiconductor layer 10 is convex upward. For example, when the semiconductor layer 10 is cut perpendicularly to the <1-100> direction, a stress is applied to the semiconductor layer 10 so that the semiconductor layer 10 below the gate electrode 30 is shifted upward and the vicinity of the source region 11 is shifted downward.

Thereby, a tensile stress is applied to the surface 10u of the semiconductor layer 10 and the vicinity of the surface 10u in a direction parallel to the <11-20> direction (see FIG. 4). As a result, a lattice spacing of the silicon carbide crystal in the <11-20> direction on the surface 10u of the well region 12 and in the vicinity of the surface 12u is longer than a lattice spacing in the <11-20> direction of the silicon carbide crystal included in the drain region 14.

The working-effect of the first embodiment will be described with a second embodiment after describing the second embodiment.

Second Embodiment

Figure 6:
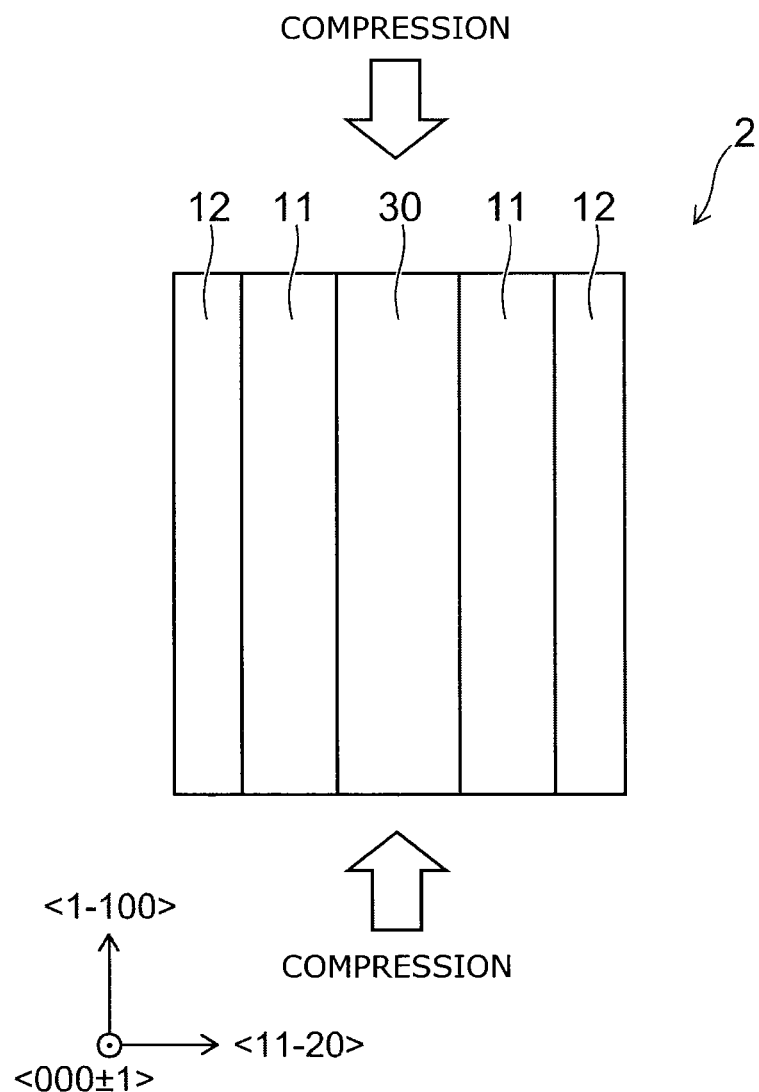
FIG. 6 is a schematic plan view showing an aspect of a strain applied to a surface of a semiconductor layer of a semiconductor device according to a second embodiment.

FIG. 6 is a schematic plan view showing an aspect of a strain applied to a surface of a semiconductor layer of a semiconductor device according to a second embodiment.

FIG. 6 does not show the source electrode 40, the interlayer insulating film 21, the gate insulating film 20 and the contact region 15. FIG. 6 shows an upper surface of the semiconductor device 2. Also in the second embodiment, the surface 10u of the semiconductor layer 10 contacting the gate insulating film 20 may be a (0001) crystal plane and may be a (000-1) crystal plane. In the surface 10u of the semiconductor layer 10 being in contact with the gate insulating film 20, a boundary between the source region 11 and the well region 12 is orthogonal to a direction of <11-20>. In the surface of the surface 10u of the semiconductor layer 10 being in contact with the gate insulating film 20, a boundary between the well region 12 and the drift region 13 is orthogonal to the direction of <11-20>. In the surface 10u of the semiconductor layer 10 being in contact with the gate insulating film 20, a direction from the source region 11 toward the drift region 13 is parallel to the direction of <11-20>.

In the semiconductor device 2, on the surface 10u of the semiconductor layer 10 and in the vicinity of the surface 10u, a compressive stress compressing the surface 10u of the semiconductor layer 10 and the vicinity of the surface 10u is applied in parallel to the <11-20> direction.

As a result, a lattice spacing of the silicon carbide crystal in the <1-100> direction on the surface 10u of the semiconductor layer 10 and in the vicinity of the surface 10u is shorter than a lattice spacing of the silicon carbide crystal in the <1-100> direction in a deep region inside the semiconductor region 10. Here, the deep region inside the semiconductor layer 10 is a region removing the surface 10u of the semiconductor layer 10 and the vicinity of the surface 10u.

Thereby, a lattice spacing of the silicon carbide crystal in the <1-100> direction on the surface 12u of the well region 12 and in the vicinity of the surface 12u is longer than a lattice spacing of the silicon carbide crystal included in the drain region 14 in the <1-100> direction.

Figure 7A:
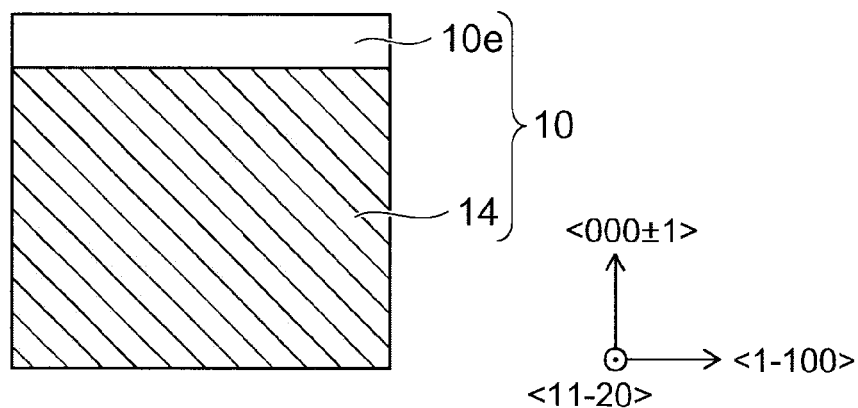
FIG. 7A to FIG. 7C are schematic plan views showing a method for applying the strain to the surface of the semiconductor layer of the semiconductor device according to the second embodiment.
Figure 7B:
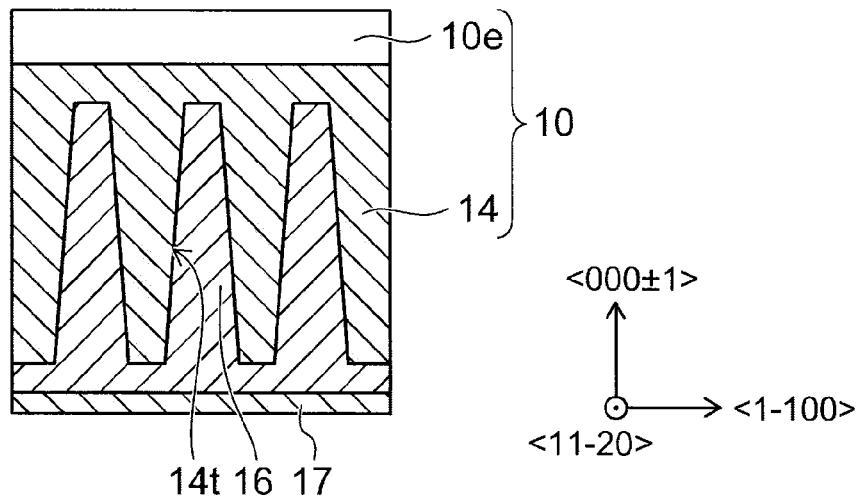
Figure 7C:
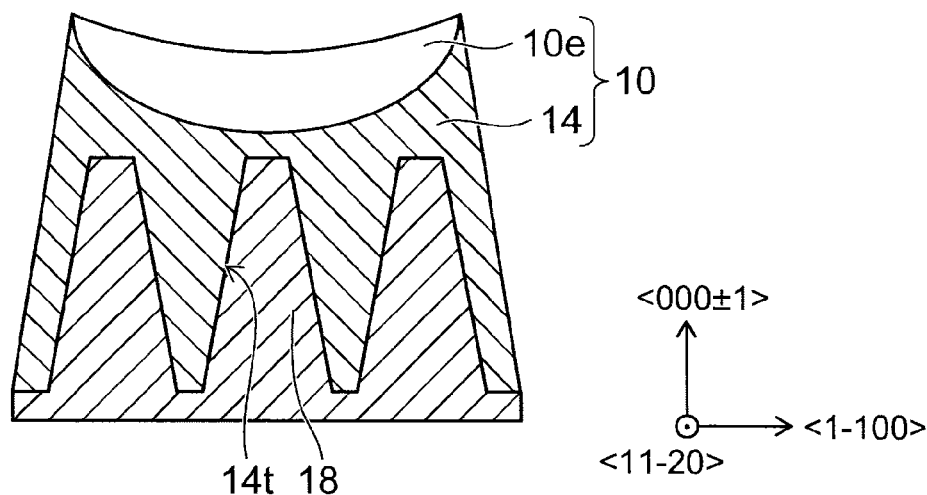

FIG. 7A to FIG. 7C are schematic plan views showing a method for applying the strain to the surface of the semiconductor layer of the semiconductor device according to the second embodiment.

FIG. 7A to FIG. 7C show a process including a process for forming the semiconductor device and a mounting process according to the second embodiment. FIG. 7A to FIG. 7C illustrate the process without thinning the drain layer, however the process is not limited to this illustration.

First, as shown in FIG. 7A, the element region 10e is formed on a drain region 14. A thickness of the drain region 14 is 360 μm. A thickness of the element region 10e is 15 μm.

Next, as shown in FIG. 7B, after a trench 14t is formed on the back side of the drain region 14, for example, by RIE (Reactive Ion Etching) process, an amorphous silicon (a-Si) layer 16 is illustratively formed in the trench 14t.

The amorphous silicon layer 16 extends also along the <11-20> direction in addition to the <000±1> direction. A plurality of amorphous silicon layers 16 are arranged along the <1-100> direction. After that, a nickel (Ni) layer 17 is illustratively formed under the amorphous silicon layer 16.

Next, as shown in FIG. 7C, the amorphous silicon layer 16 and the nickel layer 17 are subjected to heat treatment and the amorphous silicon layer is silicidized. That is, a nickel silicon (NiSi) layer 18 is formed in the trench 14t. Thereby, the nickel silicon layer 18 is connected to the drain region 14. The nickel silicon layer 18 and the drain region 14 are alternately arranged in the <1-100> direction. Here, the nickel silicon layer 18 is one example, and may be other silicon containing layer.

When the amorphous silicon layer 16 is silicidized, volume expansion of the amorphous silicon layer 16 occurs. By this volume expansion, a stress is applied to the semiconductor layer 10 so that the surface 10u of the semiconductor layer 10 is convex downward. For example, when the semiconductor layer 10 is cut perpendicularly to the <11-20> direction, a stress is applied to the semiconductor layer 10 so that the vicinity of the center of the semiconductor layer 10 shifts downward and both sides of the vicinity of the center shifts upward.

Thereby, a compressive stress is applied to the surface 10u of the semiconductor layer 10 and the vicinity of the surface 10u in the direction parallel to the <1-100> direction (see FIG. 6). As a result, a lattice spacing of the silicon carbide crystal in the <1-100> direction on the surface 12u of the well region 12 and in the vicinity of the surface 12u is shorter than a lattice spacing in the <1-100> direction of the silicon carbide crystal included in the drain region 14.

By providing the nickel silicon layer 18, a contact area between the nickel silicon layer 18 and the drain region 14 increases in comparison with not providing the nickel silicon layer 18. Thereby, the contact resistance between the nickel silicon layer 18 and the drain region 14 is more reduced than the case of not providing the nickel silicon layer 18.

The working-effect of the embodiment will be described while taking mobility or the like of the semiconductor devices 1, 2 into consideration.

Figure 8A:
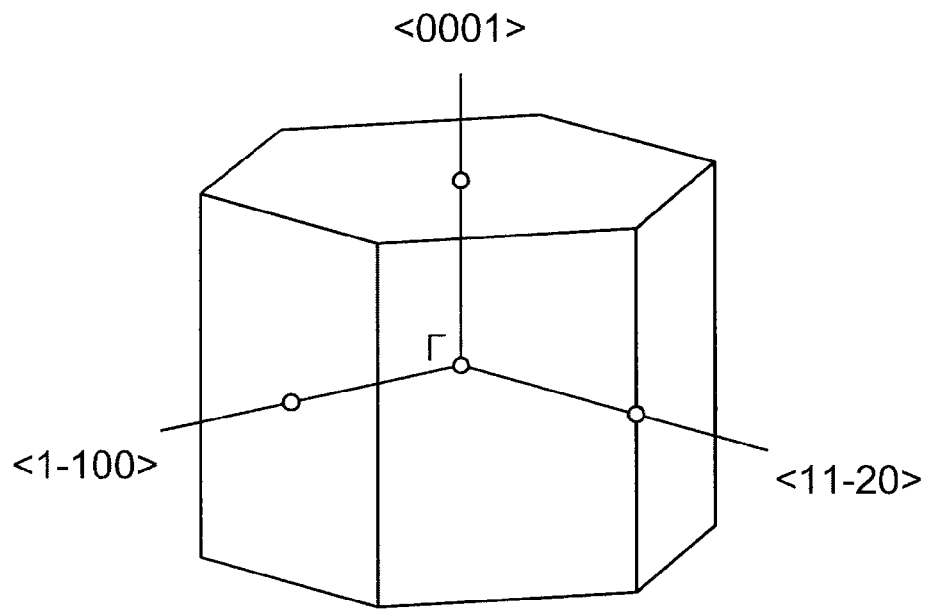
FIG. 8A is a schematic cubic diagram showing a first Brillouin zone of a 4H—SiC crystal.
Figure 8B:
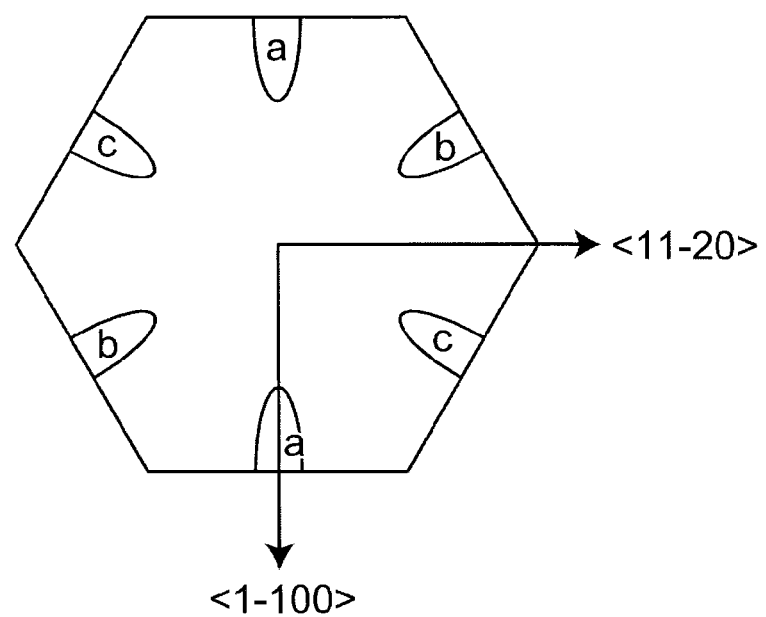
FIG. 8B is a schematic plan view showing a constant-energy surface near a bottom of a conduction band of the 4H—SiC crystal.

FIG. 8A is a schematic cubic diagram showing a first Brillouin zone of a 4H—SiC crystal, and FIG. 8B is a schematic plan view showing a constant-energy surface near a bottom of a conduction band of the 4H—SiC crystal.

FIG. 8B shows the first Brillouin zone assuming the <0001> direction to be perpendicular to a plane of paper. FIG. 8B shows constant-energy surfaces (a, b, c) in the vicinity of valley bottoms of three equivalent valleys forming conduction band end of 4H—SiC crystal.

As shown in FIG. 8B, the constant-energy surface in the vicinity of the bottom of the conduction band of 4H—SiC crystal is approximated by an elliptical plane. In a non-strained state, energy at the bottoms of three valleys is the same. Therefore, three valley bottoms are triply-degenerated. Since three equivalent valleys are disposed symmetrically around the <0001> axis, mobility is isotropic in a (0001) plane.

Figure 9:
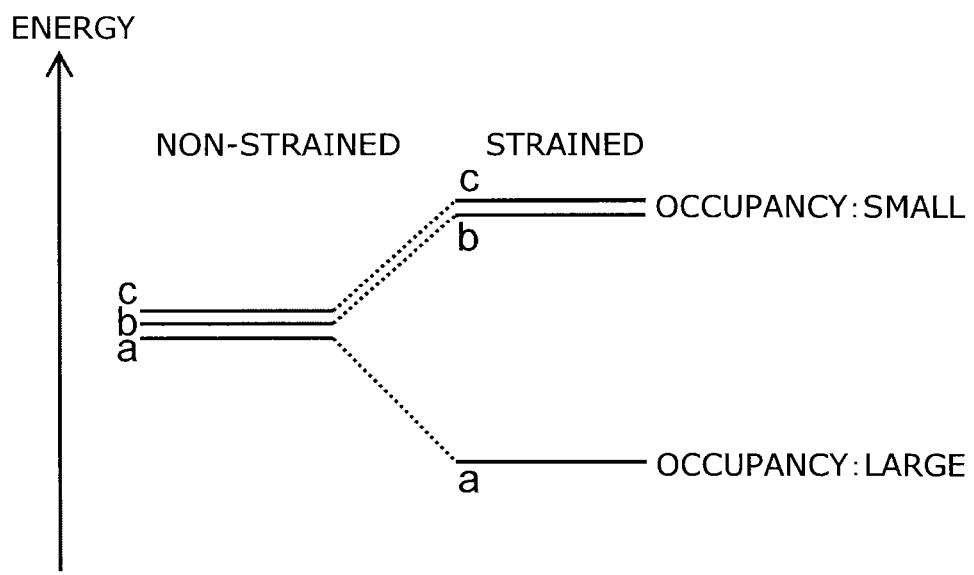
FIG. 9 is a schematic view showing energy at the bottom of the conduction band of the 4H—SiC crystal in a non-strained state and a strained state.

FIG. 9 is a schematic view showing energy at the bottom of the conduction band of the 4H—SiC crystal in a non-strained state and a strained state.

As described above, at energy at the bottom of the conduction band of 4H—SiC in the non-strained state, three equivalent valleys are triply-degenerated (left side). Application of an adequate strain to 4H—SiC in the state like this can resolve a triple degeneracy. Here, the strain means tension or compression.

When an adequate strain is applied, for example, the energy at the bottom of the conduction band of 4H—SiC is split into one valley of low energy and two valleys of high energy (right side). The valley of the low energy corresponds to the isotropic energy surface (a), and the two valleys of the high energy correspond to isotropic energy surfaces (b, c).

After the degeneracy is resolved, occupancy of electrons increases at the valley of low energy more than the valley of high energy. That is, the valley of low energy can be occupied with a larger number of electrons.

Here, when looking at each valley, an effective mass of each valley is anisotropic. For example, in the case of a spheroid of the isotropic energy surface, the effective mass in the short axis direction is lighter than the effective mass in the long axis direction. When the adequate strain is applied, a property of the valley of low energy occupied with a large number of electrons characterizes a macroscopic property of 4H—SiC. Therefore, by applying a current in the <11-20> direction, electrons can moved toward a direction decreasing the effective mass, and then the mobility increase in comparison with the non-strained state.

Figure 10A:
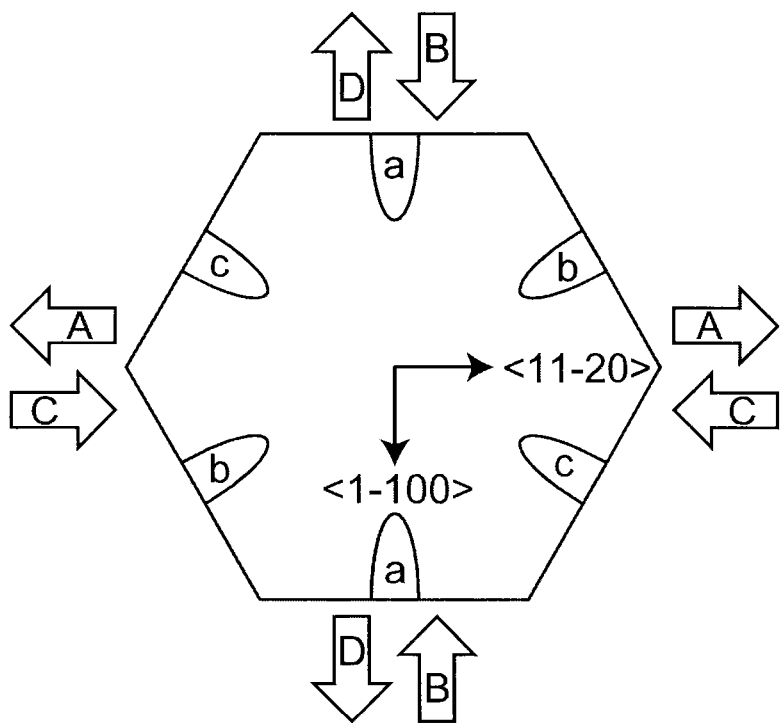
FIG. 10A is a schematic view showing combination of strain application to the 4H—SiC crystal.
Figure 10B:
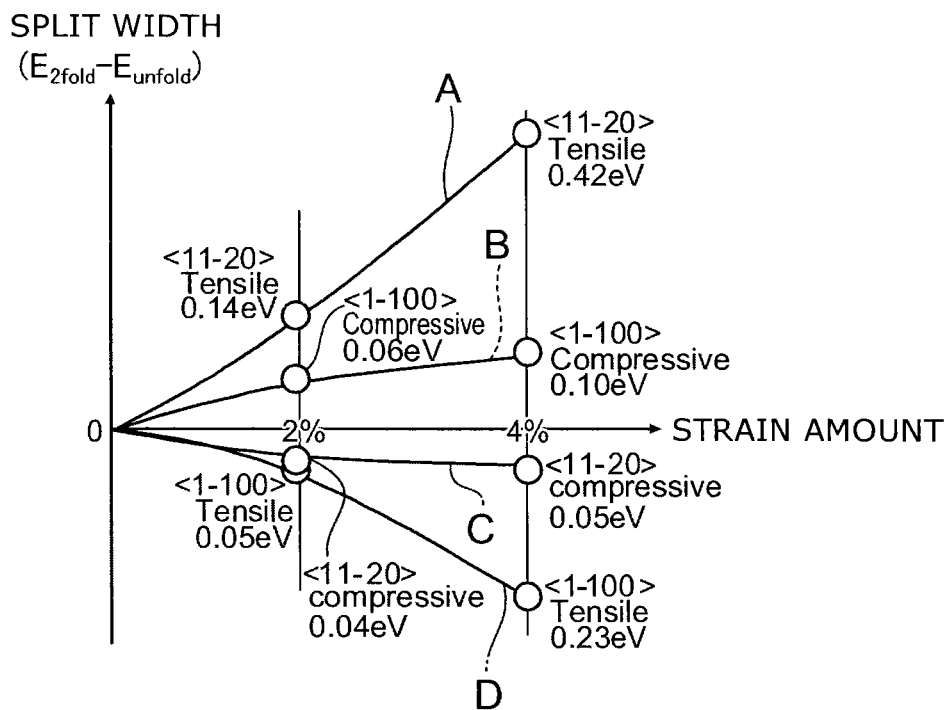
FIG. 10B is a view showing the relationship between a strain amount and an energy split width.

FIG. 10A is a schematic view showing combination of strain application to the 4H—SiC crystal, and FIG. 10B is a view showing the relationship between a strain amount and an energy split width.

When a uniaxial strain is applied within the (0001) crystal plane of 4H—SiC crystal (or within the (000-1) crystal plane), the energy at the bottom of the conduction band of 4H—SiC is split into the valley of low energy and the two valleys of high energy.

There exist four kinds of uniaxial strains.

For example, as shown in FIG. 10A, they are compression C in the <11-20> direction, tension A in the <11-20> direction, compression B in the <1-100> direction, tension D in the <1-100> direction.

FIG. 10B shows results that the energy split width of the valley in the case of applying four kinds of strain A to strain D is derived from band calculating. The lateral axis in FIG. 10B represents a strain amount (%), and the vertical axis represents a split width (eV). In order to collect a larger number of electrons to the valley of low energy, it is preferred that the energy difference is not less than a prescribed value (described later).

As shown in FIG. 10B, valley split with a desired energy split width occurred due to the tension A in the <11-20> direction or the compression B in the <1-100> direction. Furthermore, the tension A in the <11-20> direction generated a larger energy split width than the compression B in the <1-100> direction under the same strain amount.

The desired energy split width was not obtained in the compression C in the <11-20> direction and the tension D in the <1-100> direction.

For example, in the case of the strain amount of the lattice spacing being 2%, the energy split width is 0.14 eV in the tension A in the <11-20> direction, and 0.06 eV in the compression B in the <1-100> direction. Moreover, in the case of the strain amount of 4%, the energy split width is 0.42 eV in the tension A in the <11-20> direction, and 0.10 eV in the compression B in the <1-100> direction. These values are larger than thermal energy at room temperature, 0.026 eV. That is, it is possible to collect electrons more easily to the valley of low energy than to the valley of high energy by resolving the degeneracy so that the energy split width is not less than a prescribed value (for example, not less than 0.026 eV).

Figure 11:
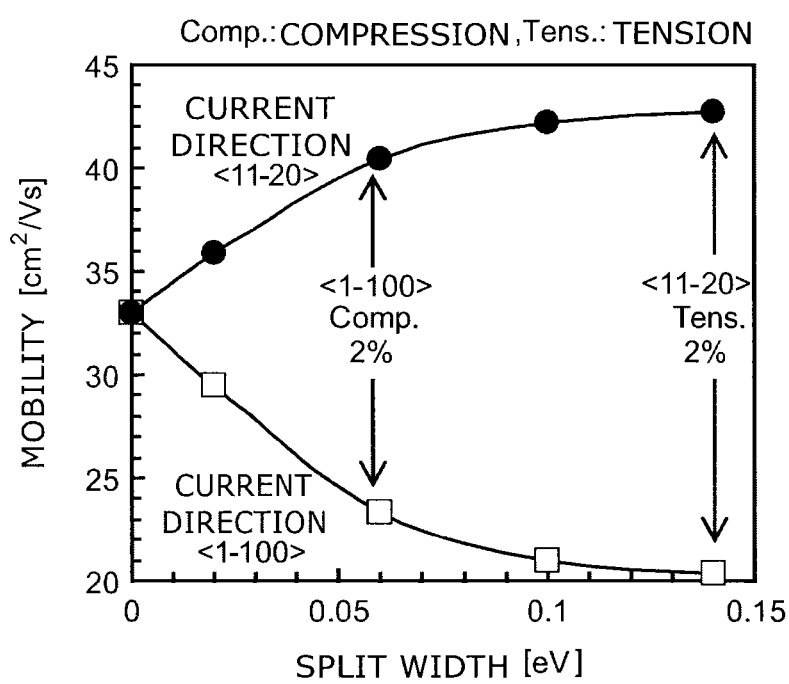
FIG. 11 is a graph view showing the relationship between the energy split width and the mobility.

FIG. 11 is a graph view showing the relationship between the energy split width and the mobility.

FIG. 11 shows the relationship between the energy split width and the mobility at the strain amount of 2%. The lateral axis represents the energy split width (eV) and the vertical axis represents the mobility ($cm^2/Vs$).

For example, in the case of the compression in the <1-100> direction, even if the energy split width (0.06 eV) is constant, the mobility in the <11-20> direction is higher than the mobility in the <1-100> direction. In the case of the tension in the <11-20> direction, even if the energy split width (0.14 eV) is constant, the mobility in the <11-20> direction is higher than the mobility in the <1-100> direction.

Even if the strain amount is constant, the mobility in the <11-20> direction is higher in the tension in the <11-20> direction than in the compression in the <1-100>.

In this way, compared with the semiconductor device without strain application, the mobility in the semiconductor devices 1, 2 increases. In other words, in the semiconductor devices 1, 2, a resistance between the source and the drain in ON state decreases, As described above, in the semiconductor devices 1, 2, a vertical type MOSFET channel region is provided in the 4H—SiC layer. The lattice spacing of 4H—SiC crystal in a local surface near-field region (first region) is different from the lattice spacing of 4H—SiC crystal in a sufficiently deep region (second region) from the substrate surface.

A thickness of the first region is preferable to be 3 nm or more from the interface with the gate insulating film. It is preferable that the lattice spacing in the <11-20> direction of the first region is longer than the lattice spacing in the <11-20> direction of the second region or that the lattice spacing in the <1-100> direction of the first region is shorter than the lattice spacing in the <1-100> direction of the second region. A difference of the lattice spacing is preferable to be not less than 2%. Main direction in which a channel region current of MOSFET flows is preferable to be parallel to the <11-20> direction.

Hereinabove, exemplary embodiments of the invention are described with reference to specific examples. However, the embodiments of the invention are not limited to these specific examples. That is, these specific examples can be added appropriately with the design variation by those skilled in the art and such specific examples are included in the scope of embodiments to the extent that the features of the embodiments are included. The components included in the previously described specific examples and its arrangement, material, condition, shape, size or the like are not limited to the illustration, and can be appropriately modified.

The components included in the previously described embodiments can be combined each other as long as technically feasible, and such combinations are also encompassed within the scope of the invention as long as they fall within the spirit of the invention. Various other variations and modifications can be conceived by those skilled in the art within the spirit of the embodiments, and it is understood that such variations and modifications are also encompassed within the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
   a gate electrode;
   a first semiconductor region including a silicon carbide crystal of 4H—SiC;
   a second semiconductor region of a first conductivity type including a first portion opposing the gate electrode, and the second semiconductor region being provided between the gate electrode and the first semiconductor region;
   a third semiconductor region of a second conductivity type having a lattice spacing different from a lattice spacing of the silicon carbide crystal of 4H—SiC, and the third semiconductor region being provided between the gate electrode and the second semiconductor region; and
   a fourth semiconductor region of the first conductivity type selectively provided on the third semiconductor region.

2. The device according to claim 1, further comprising:
   a gate insulating film provided on a surface of the third semiconductor region, on a portion of a surface of the second semiconductor region being in contact with the third semiconductor region, and on at least a portion of a surface of the fourth semiconductor region being in contact with the third semiconductor region,
   the gate insulating film being in contact with a semiconductor layer,
   the semiconductor layer including the second semiconductor region, the third semiconductor region and the fourth semiconductor region,
   a surface of the semiconductor layer being a (0001) crystal plane, and
   the lattice spacing in a <11-20> direction of the silicon carbide crystal in the third semiconductor region being in contact with the gate insulating film being longer than the lattice spacing in a <11-20> direction of the silicon carbide crystal in the first semiconductor region.

3. The device according to claim 2, wherein
   on a surface of the semiconductor layer being in contact with the gate insulating film, a boundary between the fourth semiconductor region and the third semiconductor region is orthogonal to the <11-20> direction.

4. The device according to claim 2, wherein
   on a surface of the semiconductor layer being in contact with the gate insulating film, a boundary between the third semiconductor region and the second semiconductor region is orthogonal to the <11-20> direction.

5. The device according to claim 2, wherein
   on a surface of the semiconductor layer being in contact with the gate insulating film, a direction from the fourth semiconductor region toward the second semiconductor region is parallel to the <11-20> direction.

6. The device according to claim 1, further comprising:
   a gate insulating film provided on a surface of the third semiconductor region, on a portion of a surface of the second semiconductor region being in contact with the third semiconductor region, and on at least a portion of a surface of the fourth semiconductor region being in contact with the third semiconductor region,
   the gate insulating film being in contact with a semiconductor layer,
   the semiconductor layer including the second semiconductor region, the third semiconductor region and the fourth semiconductor region,
   a surface of the semiconductor layer being a (000-1) crystal plane, and
   the lattice spacing in a <11-20> direction of the silicon carbide crystal in the third semiconductor region being in contact with the gate insulating film being longer than the lattice spacing in a <11-20> direction of the silicon carbide crystal in the first semiconductor region.

7. The device according to claim 6, wherein
   on a surface of the semiconductor layer being in contact with the gate insulating film, a boundary between the fourth semiconductor region and the third semiconductor region is orthogonal to the <11-20> direction.

8. The device according to claim 6, wherein
   on a surface of the semiconductor layer being in contact with the gate insulating film, a boundary between the third semiconductor region and the second semiconductor region is orthogonal to the <11-20> direction.

9. The device according to claim 6, wherein
   on a surface of the semiconductor layer being in contact with the gate insulating film, a direction from the fourth semiconductor region toward the second semiconductor region is parallel to the <11-20> direction.

10. The device according to claim 1, further comprising:
    a gate insulating film provided on a surface of the third semiconductor region, on a portion of a surface of the second semiconductor region being in contact with the third semiconductor region, and on at least a portion of a surface of the fourth semiconductor region being in contact with the third semiconductor region,
    the gate insulating film being in contact with a semiconductor layer,
    the semiconductor layer including the second semiconductor region, the third semiconductor region and the fourth semiconductor region,
    a surface of the semiconductor layer being a (0001) crystal plane, and the lattice spacing in a <1-100> direction of the silicon carbide crystal in the third semiconductor region being in contact with the gate insulating film being shorter than the lattice spacing in a <1-100> direction of the silicon carbide crystal in the first semiconductor region.

11. The device according to claim 10, wherein
on a surface of the semiconductor layer being in contact with the gate insulating film, a boundary between the fourth semiconductor region and the third semiconductor region is orthogonal to the <11-20> direction.

12. The device according to claim 10, wherein
on a surface of the semiconductor layer being in contact with the gate insulating film, a boundary between the third semiconductor region and the second semiconductor region is orthogonal to the <11-20> direction.

13. The device according to claim 10, wherein
on a surface of the semiconductor layer being in contact with the gate insulating film, a direction from the fourth semiconductor region toward the second semiconductor region is parallel to the <11-20> direction.

14. The device according to claim 1, further comprising:
a gate insulating film provided on a surface of the third semiconductor region, on a portion of a surface of the second semiconductor region being in contact with the third semiconductor region, and on at least a portion of a surface of the fourth semiconductor region being in contact with the third semiconductor region,
the gate insulating film being in contact with a semiconductor layer,
the semiconductor layer including the second semiconductor region, the third semiconductor region and the fourth semiconductor region,
a surface of the semiconductor layer being a (000-1) crystal plane, and
the lattice spacing in a <1-100> direction of the silicon carbide crystal in the third semiconductor region being in contact with the gate insulating film being shorter than the lattice spacing in a <1-100> direction of the silicon carbide crystal in the first semiconductor region.

15. The device according to claim 14, wherein
on a surface of the semiconductor layer being in contact with the gate insulating film, a boundary between the fourth semiconductor region and the third semiconductor region is orthogonal to the <11-20> direction.

16. The device according to claim 14, wherein
on a surface of the semiconductor layer being in contact with the gate insulating film, a boundary between the third semiconductor region and the second semiconductor region is orthogonal to the <11-20> direction.

17. The device according to claim 14, wherein
on a surface of the semiconductor layer being in contact with the gate insulating film, a direction from the fourth semiconductor region toward the second semiconductor region is parallel to the <11-20> direction.

18. The device according to claim 1, further comprising:
a gate insulating film provided on a surface of the third semiconductor region, on a portion of a surface of the second semiconductor region being in contact with the third semiconductor region, and on at least a portion of a surface of the fourth semiconductor region being in contact with the third semiconductor region,
a portion of the third semiconductor region being in contact with the gate insulating film is the third semiconductor region within at least 3 nm from a boundary between the third semiconductor region and the gate insulating film toward a side of the first semiconductor region.

19. The device according to claim 1, further comprising:
a silicon containing layer connected to the first semiconductor region.

20. The device according to claim 19, wherein
the silicon containing layer includes nickel silicon.

* * * * *